(12) United States Patent
Schneegans et al.

(10) Patent No.: US 7,212,019 B2
(45) Date of Patent: May 1, 2007

(54) PROBE NEEDLE FOR TESTING SEMICONDUCTOR CHIPS AND METHOD FOR PRODUCING SAID PROBE NEEDLE

(75) Inventors: Manfred Schneegans, Vaterstetten (DE); Frank Pietzschmann, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/826,954

(22) Filed: Apr. 15, 2004

(65) Prior Publication Data

US 2004/0239921 A1 Dec. 2, 2004

(51) Int. Cl.
*G01R 31/02* (2006.01)

(52) U.S. Cl. .................. 324/762; 324/761; 324/754

(58) Field of Classification Search ........... 324/761, 324/158.1, 754, 765; 439/482, 700, 81, 74, 439/91, 591; 29/886; 200/275, 245; 361/772, 361/774
See application file for complete search history.

(56) References Cited

U.S. PATENT DOCUMENTS

| | | | | |
|---|---|---|---|---|
| 4,189,825 A * | 2/1980 | Robillard et al. | ........... | 438/4 |
| 4,312,117 A * | 1/1982 | Robillard et al. | ........... | 438/107 |
| 4,916,002 A * | 4/1990 | Carver | ........... | 428/139 |
| 4,961,052 A * | 10/1990 | Tada et al. | ........... | 324/754 |
| 5,023,561 A | 6/1991 | Hillard | | |
| 5,073,117 A * | 12/1991 | Malhi et al. | ........... | 439/71 |
| 5,172,050 A * | 12/1992 | Swapp | ........... | 324/762 |
| 5,469,733 A * | 11/1995 | Yasue et al. | ........... | 73/105 |
| 5,594,166 A * | 1/1997 | Itoh et al. | ........... | 73/105 |
| 5,614,663 A * | 3/1997 | Itoh et al. | ........... | 73/105 |
| 5,944,537 A * | 8/1999 | Smith et al. | ........... | 439/81 |
| 6,032,994 A | 3/2000 | Chen et al. | | |
| 6,066,265 A * | 5/2000 | Galvin et al. | ........... | 216/2 |
| 6,139,759 A * | 10/2000 | Doezema et al. | ........... | 216/11 |
| 6,198,300 B1 * | 3/2001 | Doezema et al. | ........... | 324/762 |
| 6,352,454 B1 * | 3/2002 | Kim et al. | ........... | 439/886 |
| 6,426,638 B1 * | 7/2002 | Di Stefano | ........... | 324/754 |
| 6,815,962 B2 * | 11/2004 | Hirano et al. | ........... | 324/754 |
| 2001/0008707 A1 | 7/2001 | Eerden et al. | | |

FOREIGN PATENT DOCUMENTS

| | | | |
|---|---|---|---|
| DE | 3311480 A1 | | 10/1984 |
| DE | 225510 A1 | | 7/1985 |
| EP | 0660387 B1 | | 6/1999 |
| GB | 2145523 A | * | 3/1985 |
| JP | 04-354144 | | 8/1992 |
| JP | 04351968 AA | | 12/1992 |
| JP | 2000193683 A | | 7/2000 |
| JP | 2001-165959 | | 6/2001 |

\* cited by examiner

*Primary Examiner*—Paresh Patel
(74) *Attorney, Agent, or Firm*—Slater & Matsil, L.L.P.

(57) ABSTRACT

A probe needle for testing semiconductor chips includes one end that is fixed in a holding element and a free end that includes a contact tip. The probe needle is provided—at least on the surface of the contact tip—with a layer consisting of a chemically inert, electroconductive material which is hard in relation to the material of contact surfaces of the semiconductor chips. For example, the layer can be titanium nitride.

19 Claims, 1 Drawing Sheet

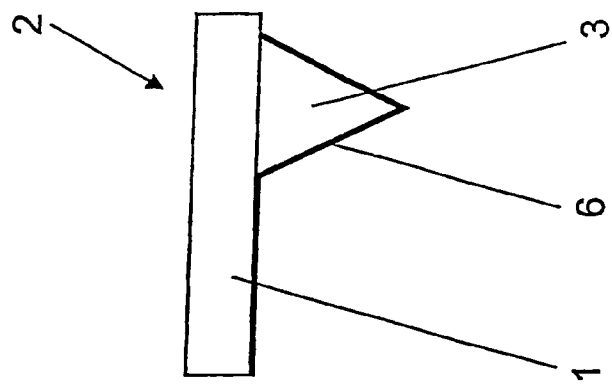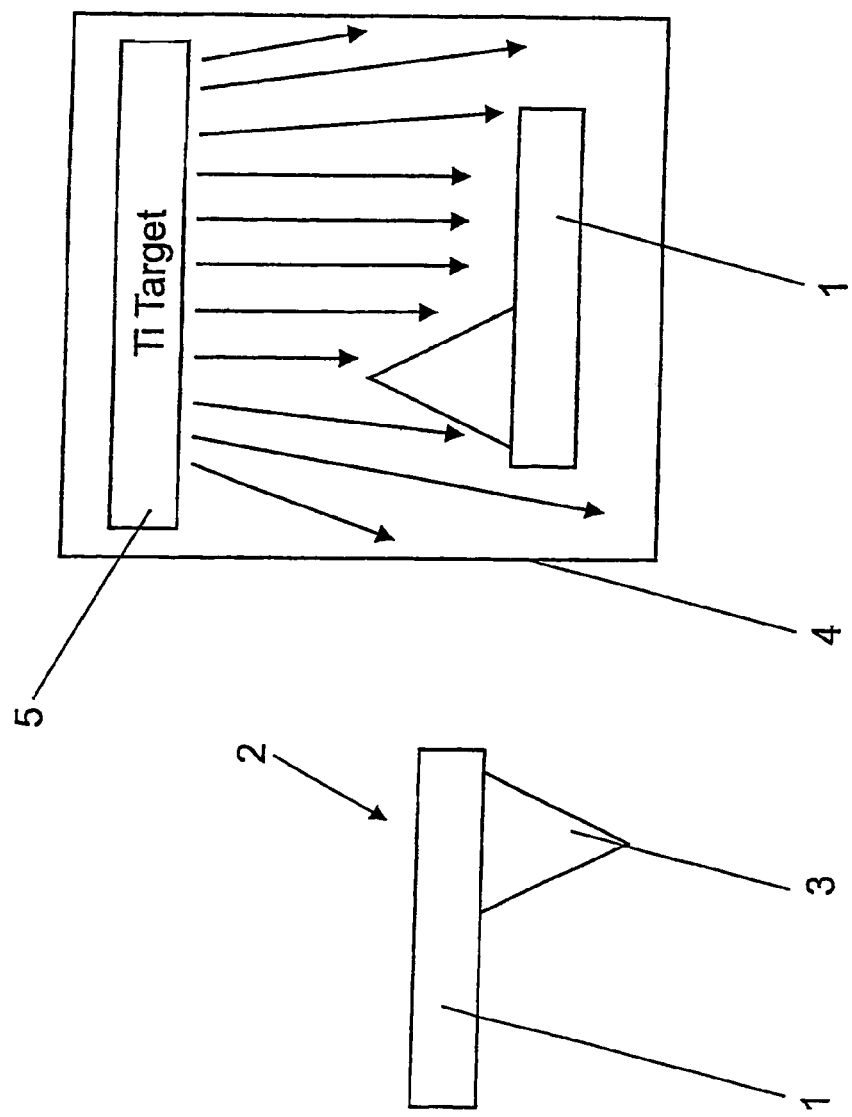

PROBE NEEDLE FOR TESTING SEMICONDUCTOR CHIPS AND METHOD FOR PRODUCING SAID PROBE NEEDLE

This application claims the benefit under 35 U.S.C. § 120 to PCT application PCT/DE02/03830, filed on Oct. 11, 2002, entitled "Probe Needle for Testing Semiconductor Chips and Method for Producing Said Probe Needle" and was not published in English, and which is based on German Application No. 101 50291.5, filed Oct. 15, 2001, both of which applications are hereby incorporated herein by reference.

TECHNICAL FIELD

The invention pertains to a probe needle for testing semiconductor chips, one end of said probe needle being fixed in a holding element and the free end thereof comprising a contact tip. The invention also pertains to a method for manufacturing a probe needle for testing semiconductor chips, with several processing steps for forming the probe needle.

BACKGROUND

Semiconductor chips are tested individually or in wafer form. Contact surfaces, e.g., the bond pads, are electrically contacted on the chip and connected via a probe needle to a test circuit. Electronic test signals are applied to the circuit on the chip via this test circuit, and the response to these test signals is measured and evaluated. If behavior deviating from the desired function is determined, the measured chip is rejected as defective, or defect parameters for the subsequent correction of defects are determined.

In order to carry out the contact of the probe needle with the contact surfaces, the relative movement between the given probe needle and the corresponding contact surface and toward one another is necessary. This movement is generally designated as touchdown. The probe needle is provided with a tip in order to improve the contact of the probe needle with the contact surface.

However, in practice, the tips oxidize after a number of touchdowns and exhibit deformation. This results in greater contact resistance with the contact surfaces. But high mechanical stability of the contact tips and low contact resistance are of crucial importance in semiconductor measuring technology.

In present practice, various cleaning methods for the contact tips, such as intermediate contacting of adhesive films or cleaning of wafers, are used to increase measurement reliability. However, conventional cleaning methods result in increased curvature of the contact tips. Also, an increase of the so-called overdrive or a double touchdown is possible for breaking up the oxide on the needle tip. However, this results in damage to the contact pad, which has disadvantages in subsequent process steps, such as wire bonding, or in further contact for measuring purposes.

The contact tips are damaged when making contact with the contact surfaces of the semiconductor chips. On the one hand, this takes place by scratching the contact tips on the contact surface, which is partially intentionally produced in order to decrease the contact resistance. On the other hand, material is also torn from the surface of the contact tip as a result of microweldings that occur when a test voltage is applied. This damage to the contact tip results in unreliable measurements, high maintenance costs, and low service life of the probe needles. In particular, when probe cards are used, the low service life of the probe needles contributes to an early failure of the cost-intensive probe cards.

The use of probe needles for testing semiconductor structures has long been known in the prior art and is described, e.g., in U.S. Pat. No. 5,023,561 or in EP Patent No. 0 660 387 B1. These publications also concern the design of probe needles, particularly the shaping of the tips, but do not solve the basic problem.

SUMMARY OF THE INVENTION

In one aspect, the present invention increases the service life of probe needles. For example, in one embodiment, the probe needle, at least on the surface of the contact tip, is provided with a coating of a chemically inert, electrically conductive material that is hard relative to the material of the contact surfaces of the semiconductor chips. Microwelding of the contact surface can be avoided by means of this coating. Also, the hardness reduces the mechanical wear of the contact tips. Thus, overall, such a coating increases the service life of the probe needle. Adverse effects on the remaining manufacturing process of the semiconductor chips are avoided because the coating material is chemically inert.

An embodiment of the invention provides for the entire surface of the probe needle or its main part to be coated. The application of the coating to other surface areas of the probe needle besides the contact tip has no disadvantageous influence on the functionality as a result of the electrical conductivity. On the contrary, this has advantages in the manufacturing process because the contact tips are not subjected to a special treatment and the remaining parts of the probe needle need not be covered; instead, the entire probe needle can be coated.

A particularly advantageous embodiment of the invention provides that the coating consist of titanium nitride. On the one hand, titanium nitride precisely satisfies the necessary criteria. On the other hand, it is a well-known coating material in semiconductor fabrication. Thus, the coatings can also be formed at low cost by the semiconductor manufacturer itself.

It can be advantageous in this connection to arrange a seed or adhesive layer of titanium beneath the titanium nitride layer, i.e., between the surface of the probe needle and the titanium nitride layer. On the one hand, this facilitates the growth of the titanium nitride layer on the substrate material of the probe needle during manufacture, which usually consists of aluminum, palladium or tungsten, and on the other hand, improves adhesion.

The preferred embodiment also solves problems in terms of the method, in that the probe needle is coated at least in the area of its contact tip, but preferably completely, with a chemically inert, electrically conductive material that is hard relative to the material of the surfaces of the semiconductor chips to be contacted. Such a coating does not constitute any significant expense in the manufacturing process of the probe needles. It can, however, significantly reduce the mechanical and electrical wear on the probe needles during use, thereby increasing their service life.

A particularly advantageous embodiment of the method of the invention provides that the probe needle be coated with titanium nitride. Semiconductor wafers are also coated with this material during the fabrication process. On the one hand, this makes coating possible by a simple means which may even be available to the user of the probe needle. On the other hand, no materials outside the technology need be used, which prevents disadvantageous effects on the rest of the technology.

In order to facilitate the growth of the titanium nitride layer and to improve the adhesiveness of the substrate material of the probe needle, it is advantageous to coat the probe needle with titanium prior to the coating with titanium nitride. Titanium nitride can then be coated.

The method of physical vapor deposition (PVD) is an advantageous method known in the field of semiconductor fabrication technology, for which reason it is advantageous if the probe needle is coated using a PVD method, preferably with a reactive magnetron sputtering method.

It is advantageous if this coating takes place from a target of titanium with the addition of a reactive gas mixture of argon and nitrogen.

If a seed or adhesive layer consisting of titanium is to be produced beneath the layer of titanium nitride, it is advantageous for a favorable shaping if the coating with titanium and titanium nitride is carried out in situ since the coating process can then take place in a processing chamber without having to be interrupted. A coating proved to be especially suitable is one in which the stoichiometric ratio of titanium (Ti) to nitrogen (N) is Ti:N=1.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is an exemplary probe needle prior to coating;

FIG. 2 is a schematic diagram of the probe needle being coated; and

FIG. 3 is an exemplary probe needle subsequent to coating.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The invention will be explained in detail in the following with reference made to an embodiment example. The associated drawings show the sequence of the method and a coated probe needle in a schematic fashion.

FIGS. 1–3 illustrate the formation of a coating layer on the end of a contact tip 3 in accordance with a preferred embodiment of the present invention. Referring first to FIG. 1, a probe needle 1, manufactured during prior processing steps, is fastened in a holding element (not shown), which can be a probe card. The probe needle is provided on its free end 2 with contact tip 3.

As shown in FIG. 2, probe needle 1 is introduced into vacuum processing chamber 4 in which a magnetron (not shown) with a titanium target 5 is arranged. Probe needle 1 is introduced into vacuum processing chamber 4 in such a way that its contact tip 3 faces in the direction of target 5, that is, opposite target 5.

After the evacuation of vacuum processing chamber 4, target material, that is, titanium as seed and adhesive layer, is applied onto probe needle 1 by the plasma produced in the chamber. A mixture of reactive gas, e.g., argon and nitrogen is introduced, as a result of which titanium nitride is produced in the plasma and is deposited onto the probe needle as coating 6. The coated tip 3 is shown in FIG. 3.

This coating 6 is very hard relative to the material of the contact surfaces (not shown) of the semiconductor chip to be contacted. It is also electrically conductive and chemically inert. As a result, the wear on probe needle 1 can be significantly reduced, which increases its service life.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A probe needle for testing semiconductor chips, the probe needle comprising:

a substantially linear elongated member including a fixed end that is fastened in a holding element;

a contact tip attached at a free end of the substantially linear elongated member, wherein at least a portion of the surface of the contact tip is provided with a coating of a chemically inert, electrically conductive material that is hard relative to the material of surfaces of the semiconductor chips to be contacted, the coating comprising titanium nitride; and an adhesive layer of elemental titanium arranged beneath the titanium nitride layer so that the adhesive layer is between the surface of the contact tip and the titanium nitride layer and contacts both the surface of the contact tip and the titanium nitride layer.

2. The probe needle according to claim 1 wherein the contact tip comprises a first surface attached to the free end of the substantially liner elongated member.

3. The probe needle according to claim 2 wherein the contact tip includes a body extending away from the elongated member, the body narrowing being widest at the surface and narrowing as it extends away from the elongated member.

4. The probe needle of claim 3 wherein the body of the contact tip narrows to a point.

5. The probe needle according to claim 1 wherein the entire surface of the contact tip is provided with the coating.

6. The probe needle according to claim 5 wherein the entire surface of the probe needle is provided with the coating.

7. The probe needle according to claim 1 wherein the holding element comprises a probe card.

8. A method for manufacturing a probe needle for testing semiconductor chips, the method comprising:

providing a probe needle that includes a contact tip;

coating at least in the area of the contact tip with a titanium layer;

coating the probe needle at least in the area of the contact tip with a chemically inert, electrically conductive material that is hard relative to the material of the contact surfaces of the semiconductor chips to be contacted, wherein the coating comprise coating with titanium nitride over the titanium layer wherein the coating with titanium and titanium nitride takes place in situ to form a bilayer of Ti:TiN over the contact tip.

9. The meted according to claim 8 wherein the coating the probe needle at least in the area of the contact tip comprises completely coating the probe needle.

10. The method according to claim 8 wherein the probe needle is coated with titanium using a physical vapor deposition (PVD) method.

11. The method according to claim 10 wherein the PVD method comprises a reactive magnetron sputtering method.

12. The meted according to claim 10 wherein the coating takes plate from a titanium target with the addition of the reactive gases, argon and nitrogen.

13. The method according to claim 8 wherein the titanium nitride comprises titanium nitride with a stoichiometric ratio of Ti:N=1.

14. A method of forming a semiconductor device, the method comprising:
fabricating a semiconductor wafer to include a number of circuits and a number of pads;
contacting a test probe to at least one of the pads, the test probe being attached to a probe card, the test probe including a substantially linear elongated member with a contact tip fastened to, the elongated member extending away from the probe card, the contact tip being coated with a layer of elemental titanium and a layer of titanium nitride overlying the layer of titanium, which form a Ti:TiN bilayer coating over the tip; and
performing an electrical test by applying a test signal to the semiconductor wafer through the test probe.

15. The method of claim 14 and further comprising, after performing an electrical test, packaging the semiconductor device.

16. The method of claim 14 wherein the step of contacting a test probe is performed on an individual semiconductor chip.

17. The method of claim 14 wherein the elongated member includes a fixed end that is fastened to the probe card and a free end, the olongated member being attached to the free end of the probe card.

18. The method of claim 17 wherein the contact tip includes a body extending away from the elongated member, the body narrowing being widest at a surface that is attached to the elongated member and narrowing as it extends away from the elongated member.

19. The method of claim 18 wherein the body of the contact tip narrows to a point.

\* \* \* \* \*